United States Patent
Fastow et al.

(10) Patent No.: US 6,294,430 B1
(45) Date of Patent: Sep. 25, 2001

(54) NITRIDIZATION OF THE PRE-DDI SCREEN OXIDE

(75) Inventors: Richard Fastow, Cupertino; Sameer S. Haddad, San Jose; Daniel Sobek, Portola Valley, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/495,213

(22) Filed: Jan. 31, 2000

(51) Int. Cl.$^7$ .................................................. H01L 21/336
(52) U.S. Cl. ............................................. 438/264; 438/923
(58) Field of Search ..................................... 438/264, 765, 438/775, FOR 189, 563, 923, FOR 203, FOR 212, FOR 402

(56) References Cited

U.S. PATENT DOCUMENTS

| 5,229,311 | * | 7/1993 | Lai et al. |
| 5,374,847 | * | 12/1994 | Araki et al. |
| 5,972,751 | * | 10/1999 | Ramsbey et al. |
| 6,069,041 | * | 5/2000 | Tanigami |
| 6,146,946 | * | 11/2000 | Wang et al. |
| 6,184,088 | * | 2/2001 | Krooka et al. |
| 6,190,973 | * | 2/2001 | Berg et al. |
| 6,207,506 | * | 3/2001 | Yi et al. |

FOREIGN PATENT DOCUMENTS 03-179781 A * 8/1991 (JP).

* cited by examiner

Primary Examiner—George Fourson
(74) Attorney, Agent, or Firm—H. Donald Nelson

(57) ABSTRACT

A flash memory device and a method of manufacturing the flash memory device having high reliability in which a gate stack is formed on a tunnel oxide formed on a substrate and a layer of oxide is formed on the surfaces of the gate stack and exposed surfaces of the substrate. Nitrogen is diffused into the layer of oxide.

10 Claims, 7 Drawing Sheets

NITRIDIZATION OF THE PRE-DDI SCREEN OXIDE

BACKGROUND OF THE INVENTION

1. Field of the Invention

This invention relates generally to floating gate semiconductor memory devices such as EEPROMs. More specifically, this invention relates to a method of manufacturing floating gate semiconductor memory devices such as EEPROMs. Even more specifically, this invention relates to a method of manufacturing floating gate semiconductor memory devices such as EEPROMs that reduces the number of oxide traps in the birds beak region of the tunnel oxide thus improving the reliability of the floating gate memory device.

2. Discussion of the Related Art

A class of non-volatile memory devices known as "flash" EEPROM (Electrically Erasable Programmable Read Only Memory) devices combines the advantages of EPROM density with the electrical erasability of an EEPROM. One feature that distinguishes flash EEPROM memory cells from standard EEPROM memory cells is that unlike standard EEPROM memory cells, flash EEPROM memory cells do not contain a select transistor on a one-for-one basis with each floating gate memory cell. A select transistor is a transistor that allows the selection of an individual memory cell within the memory device and is used to selectively erase a specific memory cell. Because flash EEPROMs do not have a select transistor for each floating gate transistor, flash EEPROM memory cells cannot be individually erased and therefore must be erased in bulk, either by erasing the entire chip or by erasing paged groups or banks of cells. Elimination of the select transistor allows for smaller cell size and gives the flash EEPROM an advantage in terms of manufacturing yield (in terms of memory capacity) over comparably sized standard EEPROMs.

Typically, a plurality of flash EEPROM cells is formed on a semiconductor substrate, which is also known as a silicon wafer. FIG. 1 illustrates a single conventional flash EEPROM memory cell having a double-diffused source region. As shown in FIG. 1, flash memory cell 100 is formed on a p-type substrate 110 and includes an n type double-diffused source region 102 and an n+ drain region 104. The drain region 104 and the source region 102 are spaced apart from each other forming a channel region 122. A source electrode 114 and a drain electrode 112 are connected to the source region 102 and the drain region 104, respectively.

The double-diffused source region 102 is formed of a lightly doped n region 128 (phosphorous doped) and a more heavily doped but shallower n+ region 130 (arsenic doped) embedded within the deep n region 128. The phosphorus doping within n region 128 reduces the horizontal electric field between the source region 102 and the substrate 110.

The floating gate 106 is disposed a short distance above the source region 102, the drain region 104 and the channel region 122 over a dielectric layer 118, which is also known as a tunnel oxide region. Above the floating gate 106 and disposed over the dielectric layer 116 is a control gate 108. The dielectric layer 116 is typically formed of an oxide/nitride/oxide layer known in the semiconductor manufacturing art as an ONO layer. A control gate electrode 120 is attached to control gate 108. The dimension $L_{GATE}$ 132 represents the gate length for the gates contained in flash memory cell 100.

In a conventional method of operation, the programming of a flash EEPROM memory cell is achieved by inducing "hot electron" injection from a section of the channel 122 near the drain 104 into the floating gate 106. The injected electrons cause the floating gate 106 to carry a negative charge. Grounding the source region 102, biasing the control gate 108 to a relatively high positive voltage and biasing the drain region 104 to a moderate positive voltage induce the hot electrons.

For example, to program the flash memory cell 100, the source electrode 114 is connected to ground, the drain electrode 112 is connected to a relatively high voltage (typically +4 volts to +9 volts) and the control gate electrode 120 is connected to a relatively high voltage level (typically +8 volts to +12 volts). Electrons are accelerated from source region 102 to drain region 104 via the channel 122 and the "hot electrons" are generated near the drain region 104. Some of the hot electrons are injected through he relatively thin gate dielectric layer 118 and become trapped in the floating gate 106 thereby giving floating gate 106 a negative potential.

After sufficient negative charge accumulates on floating gate 106, the negative potential of floating gate 106 raises the threshold voltage of the stacked gate transistor and inhibits current flow through the channel 122 during a subsequent "read" mode. The magnitude of the read current is used to determine whether a memory cell has been programmed.

Conversely, to erase a flash memory device, electrons are typically driven out of the floating gate 106 by biasing the control gate 108 to a large negative voltage and biasing the source region 102 to a low positive voltage in order to produce a sufficiently large vertical electric field in the tunnel oxide. The large vertical field 136 in the tunnel oxide produces Fowler-Nordheim (F-N) tunneling of electrons stored in the floating gate 106 through the tunnel oxide into the source region 102. Arrows 105 indicate the tunneling of the electrons from the floating gate 106 to the source region 102. The charge removed from the floating gate 106 produces a threshold voltage shift.

For example, during erasure a relatively low positive voltage (typically from +0.5 volts to +5 volts) is applied to source electrode 114 and a relatively large negative voltage (typically from −7 volts to −13 volts) is applied to control gate electrode 120. The voltage of the substrate electrode 126 is grounded and the drain electrode 112 is allowed to float. The vertical electric filed established between the control gate 108 and the source region 102 induces electrons previously stored in floating gate 106 to pass through dielectric layer 118 and into source region 102 by way of Fowler-Nordheim tunneling.

In order to produce a sufficient electric field in the tunnel oxide, it is typically necessary to bias the control gate 108 to a large enough negative voltage such that the floating gate 106 reaches a voltage of approximately −5.5 volts. A typical potential difference $V_{SF}$ between the source region 102 and floating gate 106 is on the order of 10 volts and accordingly, when the source voltage $V_S$ is made less positive, the control gate voltage $V_{CG}$ should be made more negative. Once the source to floating voltage $V_{SF}$ is selected, the remaining factors are preferably constrained according to the equation:

$$V_{FG} = \alpha_{CG}(V_{CG} - \Delta V_T) + \alpha_S V_S + \Delta_B V_B$$

where:

$V_{FG}$ = the floating gate voltage;
$V_{CG}$ = the control gate voltage;
$V_S$ = the source voltage;

$V_B$=the substrate or p-well bias;

$\Delta V_T$=the threshold voltage difference arising from negative charge added to the floating gate as measured from the control gate;

$\alpha_{CG}$=the capacitive coupling coefficient from the control gate to the floating gate;

$\alpha_S$=the capacitive coupling coefficient between the source and the floating gate;

$\alpha_B$=the capacitive coupling coefficient between the substrate or p-well and the floating gate.

As technology advances, a continuing goal throughout the industry is to increase the density of memory devices without decreasing the reliability of the memory devices. By reducing the size of a flash EEPROM device a greater memory capacity can be achieved. As can be appreciated, the more die per wafer, the cost per die can be reduced. In addition, using higher density memory devices may provide for a reduction in the overall power consumption.

In order to increase the memory density of flash EEPROM devices, the memory cells are typically scaled down in size, for example the reduction in overall footprint of the device, is accomplished by reducing the gate length ($L_{GATE}$) 132. However, a problem with reducing the length of the memory cell gates is that the distance $L_{CHANNEL}$ 122 between the source region 102 and the drain region 104 must also be reduced. As the source region 102 approaches the drain region 104, the lateral diffusion from the phosphorous in the source region 128 causes a leakage between the source region 102 and the drain region 104 resulting in detrimental short channel effects. Short channel effects produce serious problems in the flash memory cells and are typically evident when the gate length ($L_{GATE}$) 132 is reduced below 0.4 microns.

Because of the source-to-substrate biasing during the erasure of the memory cell device, a reversed-biased pn junction is formed that produces band-to-band currents (also known as Zener currents) in the source junction. The band-to-band currents are normally several orders of magnitude larger than the Fowler-Nordheim current. This band-to-band current is hard to sustain from a circuit design point of view and is also believed to generate detrimental reliability problems such as hole trapping in the tunnel oxide.

Because hole trapping phenomena is a cumulative affect caused by the band-to-band current generated during erasure of the memory cells, the shrinking of the memory device results in a smaller tunnel oxide region in which the hole trapping occurs and the reliability of the device decreases when the memory device is shrunk.

Therefore, what is needed is a memory device and a method of manufacturing a memory that provides increased reliability as the memory device is shrunk.

SUMMARY OF THE INVENTION

According to the present invention, the foregoing and other objects and advantages are achieved by a method of manufacturing a flash memory cell having improved reliability.

In an aspect of the invention, a gate stack is formed on a substrate and layer of oxide is formed on the gate stack and exposed portions of the substrate. Nitrogen is diffused into the layer of oxide.

In another aspect of the invention, ions are implanted into regions of the substrate to form double diffused source regions and drain regions.

The described method of manufacturing a flash memory cell thus provides a flash memory cell having improved reliability.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

FIG. 2A shows a portion of a flash memory device including a substrate, a layer of tunnel oxide formed on the substrate and a "gate stack" formed on the layer of tunnel oxide comprising a floating gate, a layer of ONO and a control gate;

FIG. 2B shows the portion of the flash memory device as shown in FIG. 2A after an oxidation process to form a thin layer of oxide on the gate stack to protect the gate stack from a subsequent ion implantation process;

FIG. 2C shows the portion of the flash memory device as shown in FIG. 2B undergoing an ion implantation to form source and drain regions;

FIG. 2D shows the portion of the flash memory device as shown in FIG. 2C after an anneal process to drive the implanted ions into the substrate to form the source and drain regions;

FIG. 3A shows a portion of a flash memory device including a substrate, a layer of tunnel oxide formed on the substrate and a "gate stack" formed on the layer of tunnel oxide comprising a floating gate, a layer of ONO and a control gate;

FIG. 3B shows a portion of a flash memory device as shown in FIG. 3A after an oxidation process to form a thin layer of oxide on the gate stack and exposed surfaces of the substrate to protect the gate stack from subsequent processes;

FIG. 3C shows the portion of the flash memory device as shown in FIG. 3B in an ambient of $N_2O$ or NO at high temperature to diffuse nitrogen into the layer of oxide formed on the gate stack and exposed surfaces of the substrate;

FIG. 3D shows the portion of the flash memory device as shown in FIG. 3C after the nitrogen diffusion process with a region encircled that is shown in FIG. 3E;

FIG. 3E shows the encircled region shown in FIG. 3D enlarged;

FIG. 3F shows the portion of the flash memory device as shown in FIG. 3D undergoing an ion implantation; and FIG. 3G shows the portion of the flash memory device as shown in FIG. 3F after all ion implantations with a double diffused source and drain region formed in the substrate.

DETAILED DESCRIPTION

Reference is now made in detail to a specific embodiment of the present invention that illustrates the best mode presently contemplated by the inventors for practicing the invention.

Figure 1:
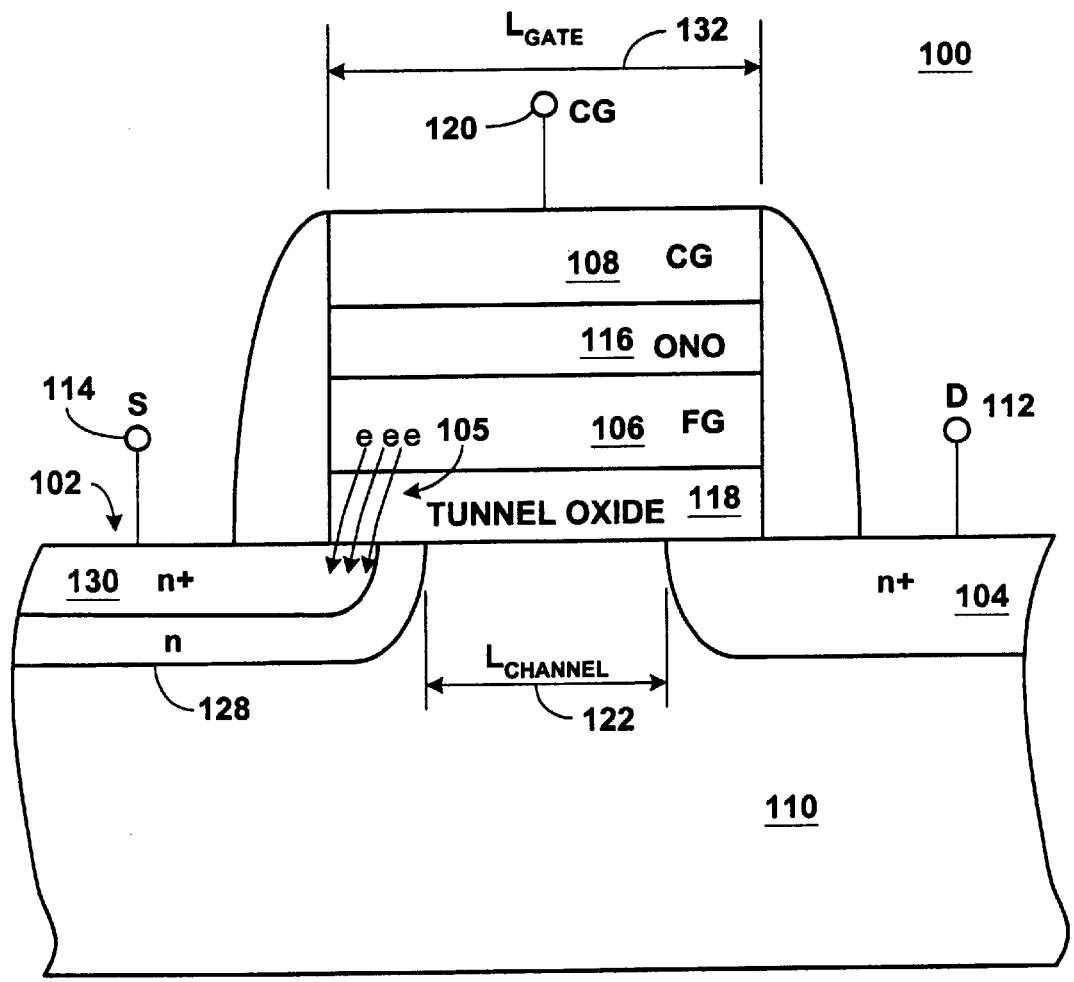
FIG. 1 shows the structure of a typical flash memory cell.
Figure 2A:
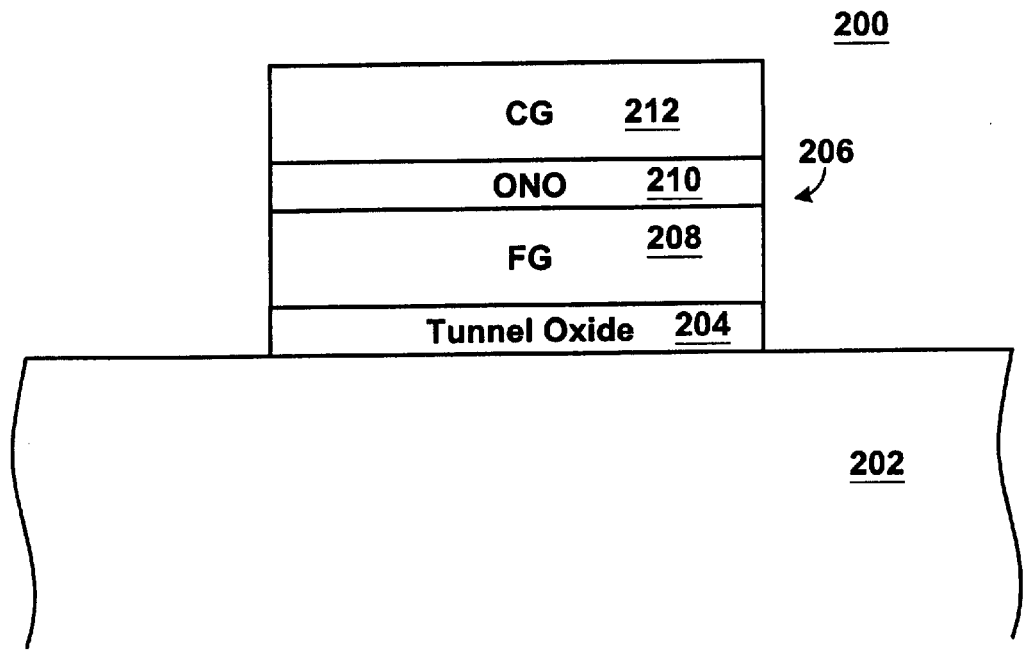
FIGS. 2A–2D illustrate a portion of a prior art process for the manufacture of flash memory devices.

FIGS. 2A–2D illustrate a portion of a prior art process for the manufacture of flash memory devices. FIG. 2A shows a portion 200 of a flash memory cell that includes a substrate 202 with a layer 204 of tunnel oxide formed on the surface of the substrate 202. A structure 206 known as a gate stack is formed on the layer 204 of tunnel oxide. As is known in the semiconductor manufacturing art, the gate stack 206 structure is formed by forming a layer of polysilicon that will be the floating gate 208, layer 210 of ONO, which is a thin layer of silicon oxide, a thin layer of silicon nitride, and a thin layer of silicon oxide, and a layer of polysilicon that will be the control gate 212. After the layers of the various materials are formed, an etch process forms the gate stack as shown in FIG. 2A.

Figure 2B:
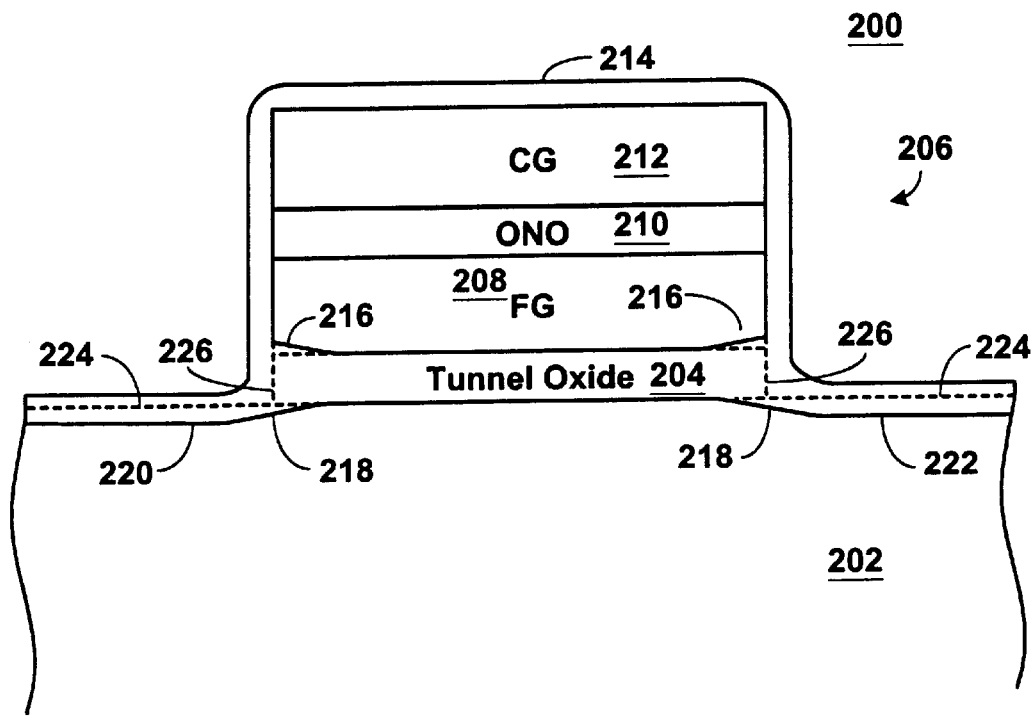

FIG. 2B shows the portion 200 of the flash memory device as shown in FIG. 2A after an oxidation process that serves to form a protective layer 214 of oxide on the gate stack to specifically protect the exposed ends of the polysilicon material that will form the floating gate 208 and the control gate 212 by forming the thin layer of oxide 214 that forms on exposed silicon surfaces. However, the oxidation process causes gate edge lifting as shown at 216 and causes oxide to form underneath a portion of the layer 204 of tunnel oxide as indicated at 218. As is known in the art of semiconductor manufacturing, the substrate, which is formed from lightly doped silicon will oxidize as shown by the solid lines 220 and 222. The dashed lines 224 show the original outline of the silicon substrate 202. The dashed lines 226 show the original outline of the tunnel oxide 204.

Figure 2C:
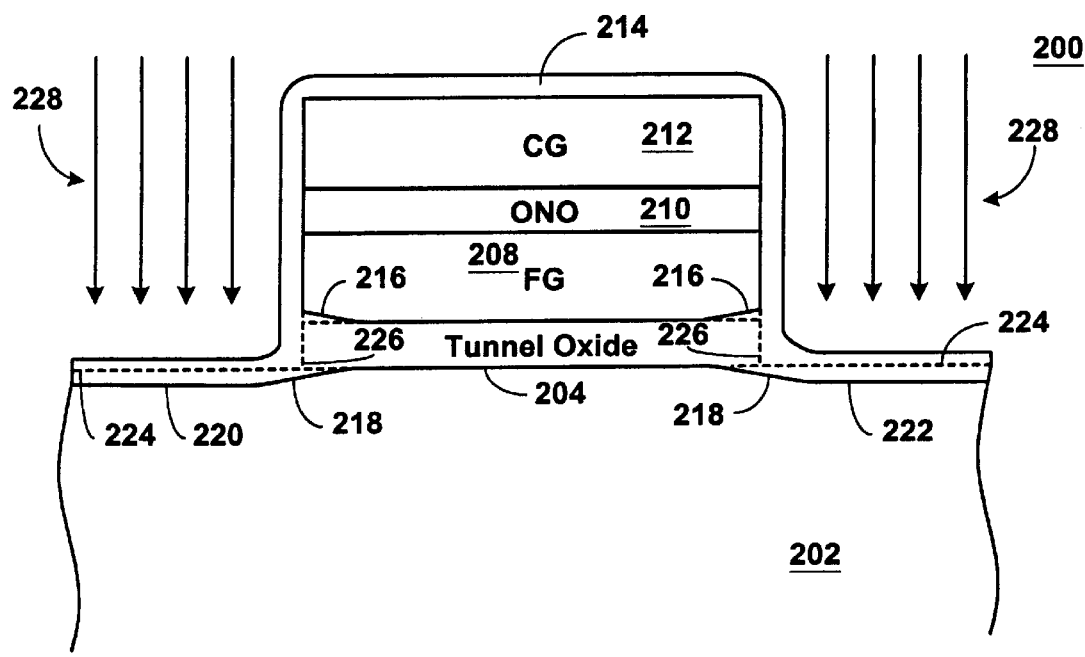

FIG. 2C shows the portion 200 of the flash memory device as shown in FIG. 2B with arrows 228 representing various ion implantations into the substrate 202 that will form the double diffused source region and the drain region. As is known in the semiconductor manufacturing art, there may be more than one ion implantation to implant phosphorus ions in the substrate to form the n region of the double diffused source region and another ion implantation to implant arsenic ions into the substrate to form the n+region of the double diffused source region and the drain region of the flash memory device.

Figure 2D:
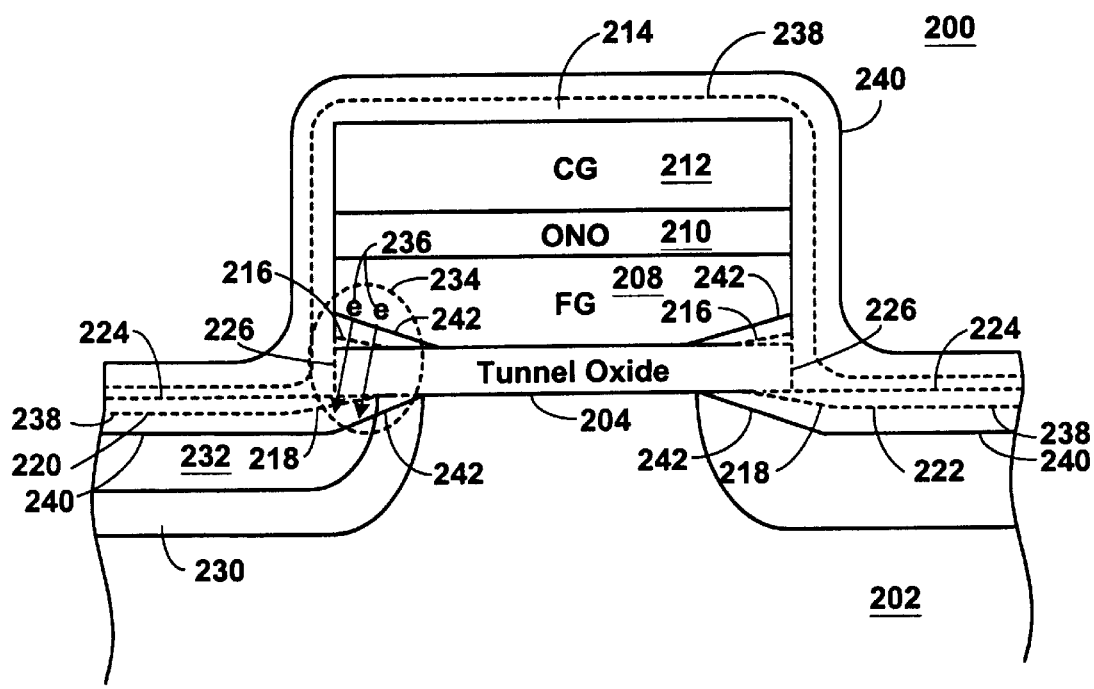

FIG. 2D shows the portion 200 of the flash memory device as shown in FIG. 2C after an anneal process to drive the phosphorus and arsenic ions into the substrate 202 to form the phosphorus implanted source region 230 and the arsenic implanted source region 232. The anneal process causes further oxidation, which causes the layer of oxide to increase in thickness. The anneal process also repairs the damage done during the implantation of dopant ions. This oxidation causes increased gate edge lifting because the oxidation is enhanced by the high impurity concentration of dopants from the implantations. The dashed line 238 indicates the original thickness of the oxide layer 214 resulting from the first oxidation and the line 240 indicates the outline of the increased thickness of the layer of oxide. The anneal process also causes increased gate edge lifting as indicated at 242. As is known in the semiconductor manufacturing art, phosphorus ions migrate more readily than arsenic ions and a single anneal in a region that contain both phosphorus ions and arsenic ions can result in a double diffused region as shown by regions 230 and 232. As shown within circle 234, the tunnel oxide at the source end has been thickened in the region at which the electrons indicated at 236 must tunnel from the floating gate 204 to the source region 232 across the tunnel oxide 204 during the Fowler-Nordheim erase procedure. As known in the flash memory art, the electrons tunnel across the tunnel oxide 204 to the portion of the double diffused source region that has arsenic ions implanted. As discussed above, the electrons have to tunnel through a thicker tunnel oxide, which as also discussed above, may vary from memory cell to memory cell and may cause each memory cell to have differing erase characteristics. As discussed above, one advantage of the thicker tunnel oxide is that the effects of hole trapping are spread out and thus the reliability of the device may not be decreased, however, the memory device cannot be shrunk.

Figure 3A:
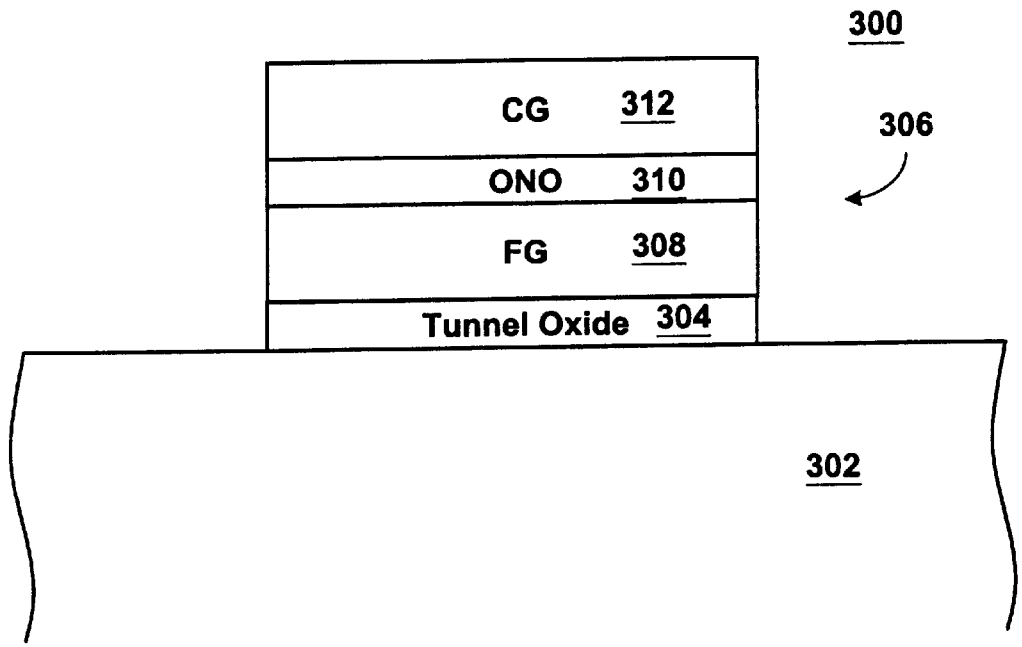
FIGS. 3A–3G illustrate a portion of a process for the manufacture of flash memory devices in accordance with the present invention.

FIGS. 3A–3H illustrate a portion of a process for the manufacture of flash memory devices in accordance with the present invention. FIG. 3A shows a portion 300 of a flash memory device that includes a substrate 302 with a layer 304 of tunnel oxide formed on the surface of the substrate 302. A structure 306 known as a gate stack is formed on the layer 304 of tunnel oxide. As is known in the semiconductor manufacturing art, the gate stack 306 structure is formed by forming a layer of polysilicon that will be the floating gate 308, layer 310 of ONO, which is a thin layer of silicon oxide, a thin layer of silicon nitride, and a thin layer of silicon oxide, and a layer of polysilicon that will be the control gate 312. After the layers of the various materials are formed, an etch process forms the gate stack as shown in FIG. 3A.

Figure 3B:
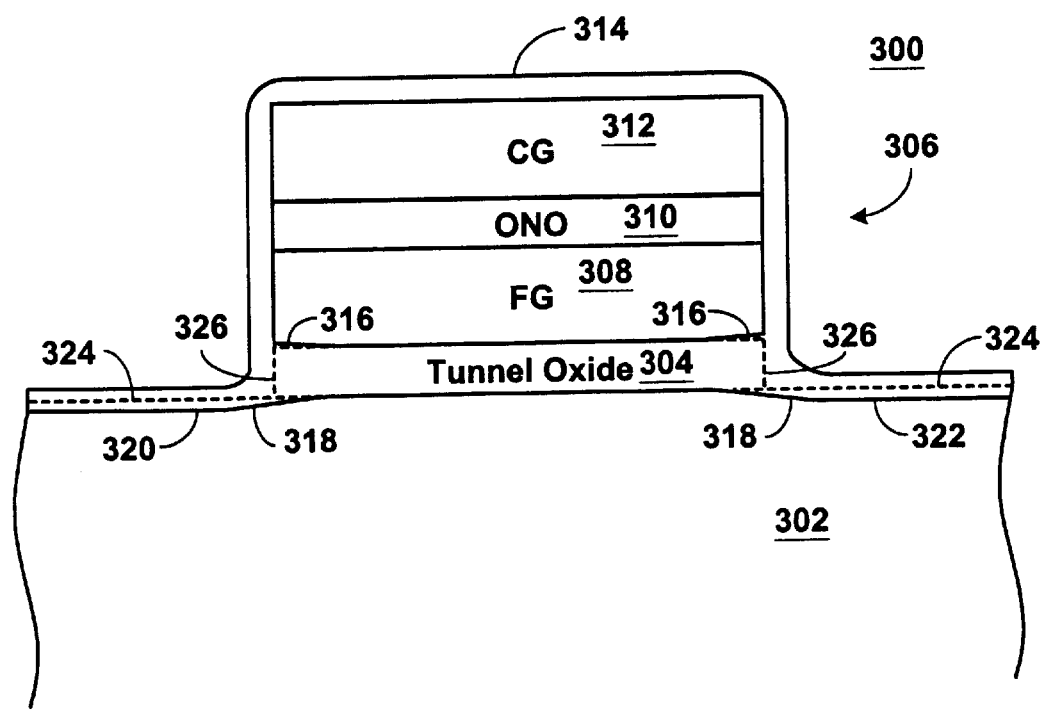

FIG. 3B shows the portion 300 of the flash memory device as shown in FIG. 3A after an oxidation process known as a pre-DDI oxidation that serves to form a protective layer 314 of oxide on the gate stack to specifically protect the exposed ends of the polysilicon material that will form the floating gate 308 and the control gate 312 by forming a thin layer of oxide 314 that forms on exposed silicon surfaces. It is noted that in contrast to the prior art process, the thin layer of oxide 314 can be significantly thinner than the corresponding layer of oxide 214 (FIG. 2B) formed in the prior art process. Because the layer of oxide 314 can be significantly thinner, the oxidation process can be shorter and as a result the gate edge lifting as shown at 316 is significantly less than that experienced in the prior art process (216 FIG. 2B). In addition, the oxide that forms underneath the layer 304 of tunnel oxide is also significantly less than that experienced in the prior art process (218 FIG. 2B). The combination of the lesser gate edge lifting and the less growth of oxide underneath the tunnel oxide results in a thinner tunnel oxide layer 304 than that achieved in the prior art process (204 FIG. 2B). The dashed lines 324 and 326 show the original outline of the substrate 302 and tunnel oxide 304, respectively.

Figure 3C:
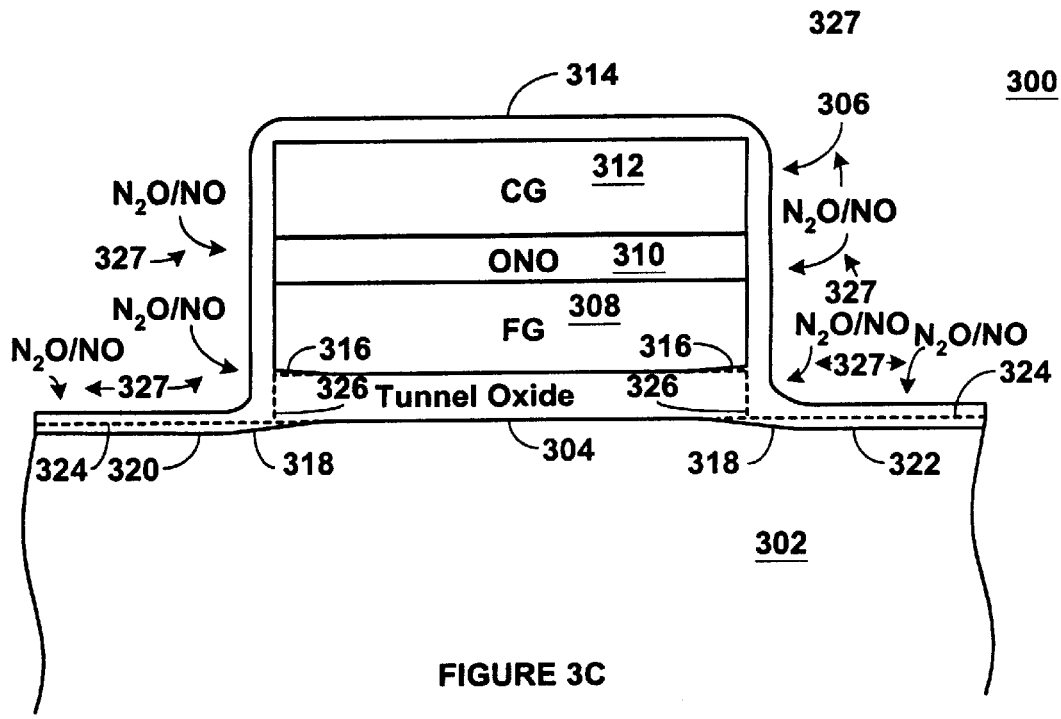

FIG. 3C shows the portion 300 of the flash memory device as shown in FIG. 3B undergoing a diffusion of nitrogen into the gate oxide formed in a previous process. The flash memory device is placed in an ambient of either nitrogen dioxide ($N_2O$) or nitrogen oxide (NO). The diffusion of nitrogen is at a high temperature and is done in a furnace. The process of diffusing nitrogen into an oxide is well known and will not be further discussed. Arrows 327 indicate the diffusion of nitrogen into the layer 314 of oxide.

Figure 3D:
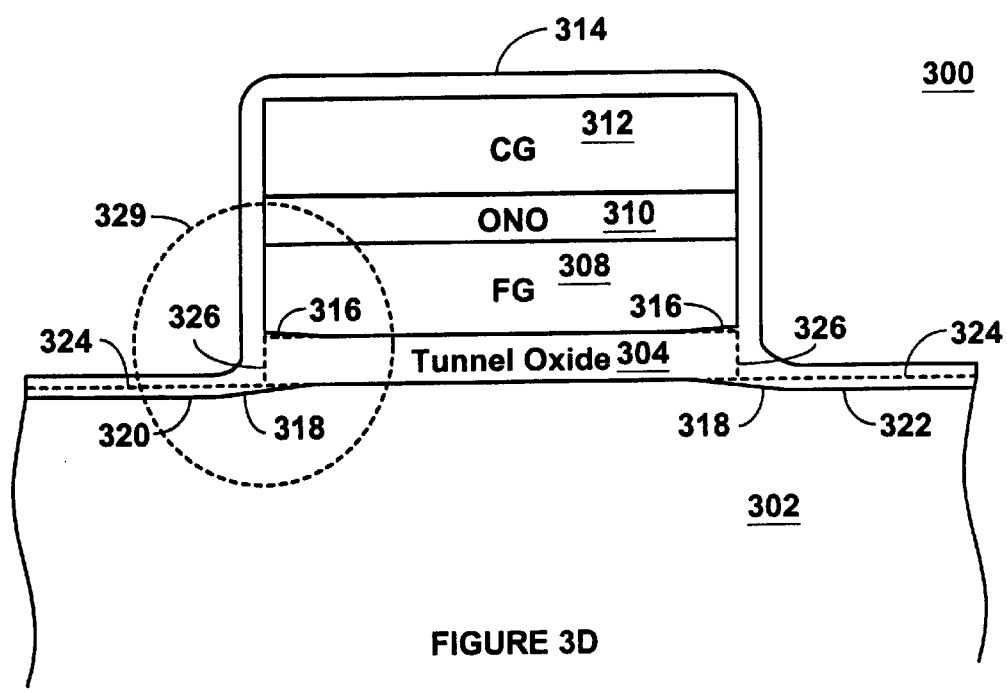

FIG. 3D shows the portion 300 of the flash memory device as shown in FIG. 3C after the diffusion of nitrogen into the layer 314 of oxide. The dashed circle 329 indicates a region that is shown enlarged in FIG. 3E.

Figure 3E:
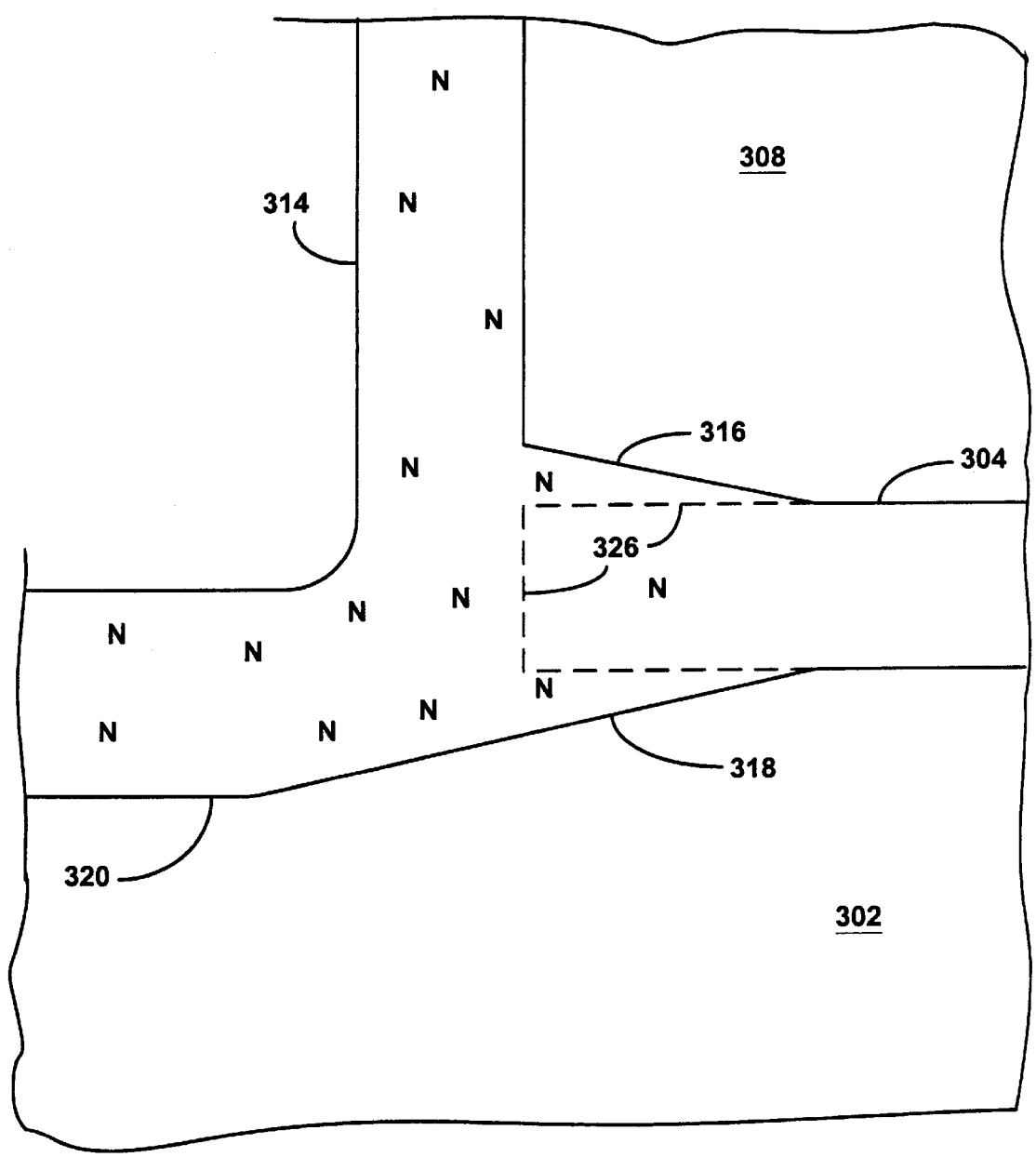

FIG. 3E shows the region indicated inside the dashed circle 329 in FIG. 3D. The original outline of the tunnel oxide 304 is indicated by dashed line 326. The layer 314 is shown merging with the tunnel oxide 304 and lines 316, 318 and 320 show the resulting outline of the oxide region formed after the pre-DDI oxidation process. The nitrogen (N) is shown in the merged layer 314 of oxide and tunnel oxide 304.

Figure 3F:
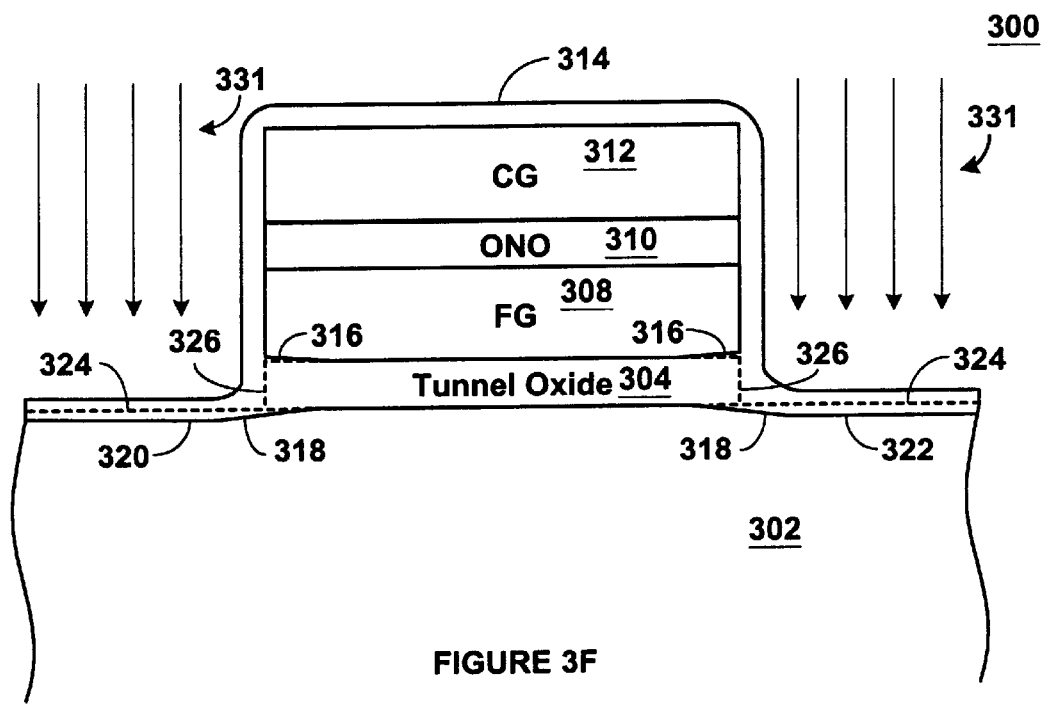

FIG. 3F shows the portion 300 of the flash memory device as shown in FIG. 3D undergoing ion implantation as indicated by arrows 331. As should be appreciated, the implantation of dopants to form the double diffused source region may be done in one or two processes. However, because one region of the double diffused source has phosphorus ions that are not implanted into the drain region, typically the drain region is masked and phosphorus ions are implanted into regions of the substrate in which sources are to be formed. The mask is then removed and arsenic ions are then implanted to form the second region of the double diffused source and to form the drain region.

Figure 3G:
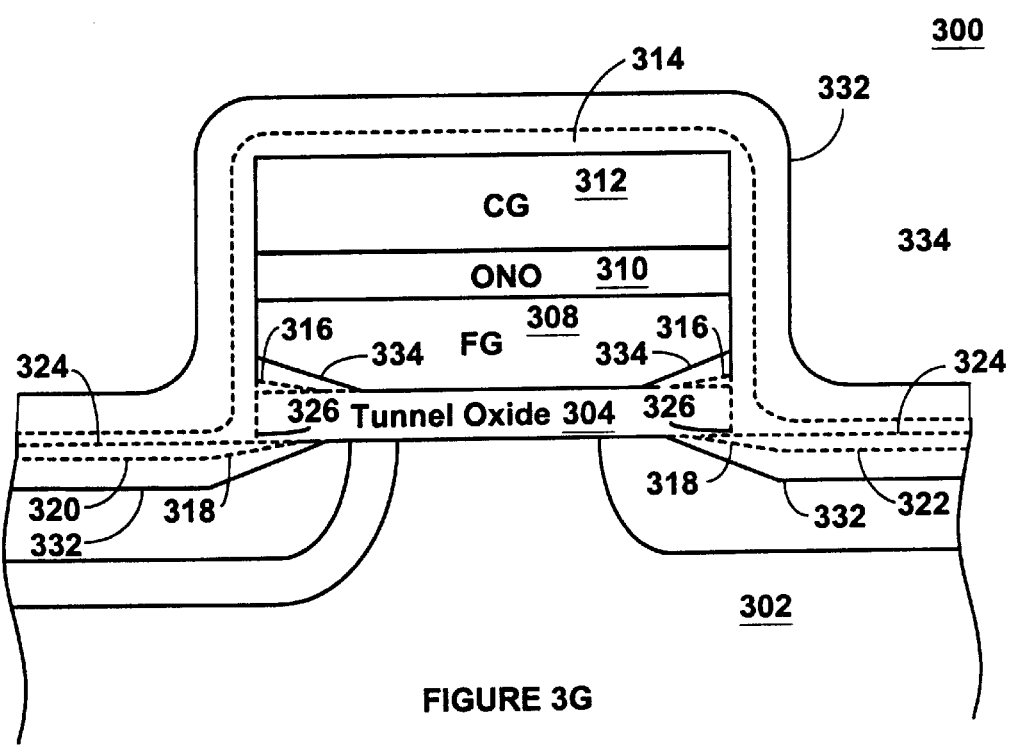

FIG. 3G shows the portion 300 of the flash memory device as shown in FIG. 3F after an anneal process to drive the implanted ions into the substrate to form the double diffused source region and the drain region and to repair the damage caused by the ion implantation. As discussed above, the anneal process also causes further oxidation indicated at 332 that adds to the layer 314 of oxide formed in a previous process. It is noted that the gate edge is further increased as indicated 334.

In summary, the present invention overcomes the limitations of the prior art and fulfills the need for a flash memory cell having improved reliability.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing a flash memory device having increased reliability, wherein the method comprises:
   (a) forming a gate stack on a substrate wherein the gate stack includes a tunnel oxide formed on the substrate, a floating gate formed on the tunnel oxide, a layer of dielectric formed on the floating gate and a control gate formed on the layer of dielectric;
   (b) forming a layer of oxide on the gate stack and exposed portions of the substrate; and
   (c) diffusing nitrogen into the layer of oxide formed on the gate stack and exposed portions of the substrate.

2. The method of claim 1 further comprising (d) implanting a first type of ions into a region of the substrate in which a source region is to be formed.

3. The method of claim 2 further comprising (e) implanting a second type of ions into the region of the substrate in which the source region is to be formed.

4. The method of claim 3 further comprising (f) implanting the second type of ions into a region of the substrate in which a drain region is to be formed.

5. The method of claim 1 wherein step (c) is accomplished by placing the flash memory device in an ambient of nitrogen dioxide in a high temperature furnace.

6. The method of claim 1 wherein step (c) is accomplished by placing the flash memory device in an ambient of nitrogen oxide in a high temperature furnace.

7. The method of claim 4 further comprising (g) annealing the flash memory device forming a double diffused source region and a drain region.

8. A flash memory device having increased reliability, comprising:
   a gate stack formed on a substrate wherein the gate stack includes a tunnel oxide formed on the substrate, a floating gate formed on the tunnel oxide, a layer of dielectric formed on the floating gate and a control gate formed on the layer of dielectric;
   a layer of oxide formed on surfaces of the gate stack and exposed surfaces of the substrate; and
   nitrogen diffused into the layer of oxide.

9. The flash memory device of claim 8 further comprising a double diffused source region formed in the substrate.

10. The flash memory device of claim 9 further comprising a drain region formed in the substrate.

* * * * *